(12) United States Patent
Kumakawa

(10) Patent No.: US 12,257,650 B2
(45) Date of Patent: Mar. 25, 2025

(54) JOINED STRUCTURE, JOINING METHOD, AND JOINING MATERIAL

(71) Applicant: Panasonic Intellectual Property Management Co., Ltd., Osaka (JP)

(72) Inventor: Takahiro Kumakawa, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 1117 days.

(21) Appl. No.: 16/990,285

(22) Filed: Aug. 11, 2020

(65) Prior Publication Data

US 2020/0373269 A1 Nov. 26, 2020

Related U.S. Application Data

(62) Division of application No. 16/199,807, filed on Nov. 26, 2018, now abandoned.

(30) Foreign Application Priority Data

Dec. 1, 2017 (JP) .................................. 2017-231347

(51) Int. Cl.
*B23K 35/02* (2006.01)
*B22F 1/054* (2022.01)
(Continued)

(52) U.S. Cl.
CPC ............ *B23K 35/025* (2013.01); *B22F 1/054* (2022.01); *B22F 7/064* (2013.01); *B32B 15/04* (2013.01);
(Continued)

(58) Field of Classification Search
None
See application file for complete search history.

(56) References Cited

U.S. PATENT DOCUMENTS 8,129,001 B2 * 3/2012 Wang .................... H01L 23/373
427/532
8,303,854 B2 * 11/2012 Kajiwara ................ H01L 24/83
252/514

(Continued)

FOREIGN PATENT DOCUMENTS

| CN | 102646650 | 8/2012 |
| CN | 103153527 | 6/2013 |

(Continued)

OTHER PUBLICATIONS

English Translation of Chinese Search Report dated Jan. 29, 2021 for related Chinese Patent Application No. 201811423164.X.

*Primary Examiner* — Devang R Patel
(74) *Attorney, Agent, or Firm* — Wenderoth, Lind & Ponack, L.L.P.

(57) ABSTRACT

A joined structure includes: a first member; and a second member that faces the first member and that is joined to the first member via a joining layer. The joining layer includes a metal material and a solder material, apart of the metal material has at least one pore, and the solder material is located in a part of an internal area of the at least one pore. Also disclosed is a joining method that makes it possible to produce the joined structure. Further disclosed is a joining material used in the joining method. The joining method makes it possible to achieve non-pressurization sintering processes while maintaining high precise thickness of a joining layer between the first layer and the second layer based on the spacer.

5 Claims, 4 Drawing Sheets

(51) Int. Cl.
*B22F 7/06* (2006.01)
*B32B 15/04* (2006.01)
*B32B 15/16* (2006.01)
*H01L 23/00* (2006.01)
*B22F 1/10* (2022.01)

(52) U.S. Cl.
CPC .............. *B32B 15/16* (2013.01); *H01L 24/29* (2013.01); *H01L 24/83* (2013.01); *B22F 1/10* (2022.01); *B32B 2264/105* (2013.01); *H01L 2224/29209* (2013.01); *H01L 2224/29213* (2013.01); *H01L 2224/29239* (2013.01); *H01L 2224/29499* (2013.01); *H01L 2224/8384* (2013.01); *H01L 2224/83862* (2013.01)

(56) References Cited

U.S. PATENT DOCUMENTS

| | | | |
|---|---|---|---|
| 8,555,491 B2* | 10/2013 | Boureghda | H05K 13/0465 |
| | | | 29/846 |
| 8,840,811 B2* | 9/2014 | Yasuda | H01L 23/492 |
| | | | 252/514 |
| 9,221,130 B2 | 12/2015 | Asada et al. | |
| 9,362,242 B2* | 6/2016 | Iwata | H01L 24/05 |
| 9,627,342 B2* | 4/2017 | Saito | H01L 24/27 |
| 10,308,856 B1* | 6/2019 | Wang | B23K 35/36 |
| 10,756,047 B2* | 8/2020 | Konno | H01L 24/83 |
| 2007/0183920 A1* | 8/2007 | Lu | B22F 7/064 |
| | | | 75/252 |
| 2007/0221404 A1 | 9/2007 | Cas et al. | |
| 2010/0044860 A1 | 2/2010 | Haba et al. | |
| 2010/0187678 A1* | 7/2010 | Kajiwara | H01L 24/83 |
| | | | 257/692 |
| 2011/0290863 A1* | 12/2011 | Kajiwara | C22C 1/0466 |
| | | | 252/76 |
| 2012/0211764 A1 | 8/2012 | Okamoto | |
| 2013/0134591 A1 | 5/2013 | Sakamoto | |
| 2015/0115452 A1* | 4/2015 | Yoon | H01L 24/29 |
| | | | 228/256 |
| 2017/0229415 A1 | 8/2017 | Hsu et al. | |
| 2017/0368643 A1* | 12/2017 | Gu | B23K 35/262 |

FOREIGN PATENT DOCUMENTS

| | | |
|---|---|---|
| JP | 2008-294441 | 12/2008 |
| JP | 2011-071301 | 4/2011 |
| JP | 2012-500494 | 1/2012 |
| JP | 2012-35291 | 2/2012 |
| JP | 2012-174927 | 9/2012 |
| JP | 2017-143134 | 8/2017 |
| WO | 2012/081255 | 6/2012 |

* cited by examiner

JOINED STRUCTURE, JOINING METHOD, AND JOINING MATERIAL

TECHNICAL FIELD

The technical field relates to joined structures that may be semiconductor devices, joining methods, and joining materials. In particular, the technical field relates to joining methods in which semiconductor devices are joined to certain materials based on metal nanoparticles, and resulting joined structures.

BACKGROUND

For the methods of mounting semiconductor devices (e.g. semiconductor power devices and super luminosity LEDs) onto circuit substrates and heat-radiation boards, techniques based on metal nanoparticles serving as joining materials have attracted a great deal of attention.

The metal nanoparticles are metal particles that have a size smaller than 100 nm, and that may be made of Au, Ag, Cu, Sn, or the like.

The metal nanoparticles have high surface activity, and have lower melting points, because of their fine structures. Therefore, the metal nanoparticles make it possible to sinter at lower temperatures (e.g. 150-350° C.)

Furthermore, when the metal nanoparticles are joined to one another, thus having larger sizes, the metal nanoparticles have higher melting points that would be almost equal to melting points of ordinary-size metal materials having a millimeter scale thickness or an even larger thickness (hereinafter, referred to as bulk metal materials).

Therefore, the metal nanoparticles are suitable for applications to a wide range of products that require reductions in heat stress caused in mounting of semiconductor devices, and improvements on service temperature limits even after the semiconductor devices are mounted.

In general, joining processes based on the metal nanoparticles are carried out based on nanometal pastes that are formed by dispersion of metal nanoparticles, protected by dispersing agents, in solvents.

In the conventional joining methods, the nanometal pastes are supplied onto first members (e.g. substrates) based on screen printing, use of dispensers, etc., second members (e.g. semiconductor elements) are temporarily immobilized thereon with mounters. Subsequently, the resulting products are preheated to certain temperatures (e.g. 100-150° C.) in high-temperature furnaces, thereby causing solvents in the nanometal pastes to evaporate. Then, the products are heated to sintering temperatures (e.g. 200-300° C.) to progress the sintering process, thereby forming joining layers.

Furthermore, pressurization treatments may be carried out together with the heat treatments during the sintering process in order to form more rigid joining layers. However, in recent years, a variety of non-pressurization sintering-type nanometal pastes that realizes sufficient joining strength even without any particular pressurization treatments have been increased, because dispersing agents and solvents included in the nanometal pastes, and materials for the metal nanoparticles have been improved, and compositions for the nanometal pastes have been optimized.

Degrees of precision of the thickness of joining layers after sintering and joining of the metal nanoparticles would be determined depending almost on accuracy of the step of temporal immobilization of the second members. This is because volumetric shrinkages of the nanometal pastes are uniformly achieved during evaporation of solvents and the sintering process, when the joint areas are viewed in macroeconomic terms.

Furthermore, when the products are heated while they are pressurized, heating in the sintering process, and accuracy in the pressurization process become dominant.

As a method for enhancing degrees of precision of thickness of the joining layers, methods in which spacers are placed between joined areas have previously been studied (e.g. see JP-A-2011-71301).

FIGS. 3A-3D show a conventional joining method disclosed in JP-A-2011-71301 using metal nanoparticles.

At first, as shown in FIG. 3A, a nanometal paste 102, and spacers 103a are coated onto a joining surface of a first member 101, and then, a second member 104 is mounted thereon as shown in FIG. 3B. Subsequently, a resulting product is heated to a temperature that causes solvents contained in the nanometal paste 102 to evaporate, in a high-temperature furnace, thereby removing the solvents (not shown in the figure). In this case, a volumetric shrinkage of the nanometal paste 102 will occur due to evaporation of the solvents.

Since original shapes and sizes of spacers 103a are maintained at this point, the spacers 103a serve as propping bars, and, consequently, spaces equivalent to the volumetric shrinkage are produced between the nanometal paste 102 and the second member 104.

Next, as shown in FIG. 3C, while the product is pressurized at a pressure causing plastic deformation of the spacer 103b, with a pressure device 106, the product is heated to a temperature that achieves sintering of metal nanoparticles, in a high-temperature furnace 105.

Thus, the sintering process is progressed to form a joined structure 200.

By way of continuing the pressurization to realize the plastic deformation as seen in the spacers 103b, the aforementioned space caused in association with the volumetric shrinkage of the nanometal paste during the evaporation of solvents is squashed, and the rigid junction is realized after the sintering process.

SUMMARY

However, since a certain pressure is required to cause the plastic deformation of the spacer during the sintering process in the above-described convention joining method, an apparatus for controlling heating and pressurization at the same time is always required.

In general, accuracy of control of pressurization at a high-temperature state is difficult due to influences of strain caused from thermal expansion of the equipment.

As a consequence, there are problems in which the facility would become expensive, and daily maintenance of the equipment would become laborious.

Furthermore, since not only a mere heat treatment but also a pressurization treatment are required, mass production, in which, for example, multiple joined structure are processed at the same time, would be difficult, and thus, there is a problem of difficulty in improving the productivity.

The purpose of the disclosure is to solve the above-described problems in the conventional art. That is, an object of the disclosure is to provide joining materials having high precision of thickness of joining layers, joining methods, and joined structures.

In order to achieve the above-mentioned purpose, according to a first aspect of the disclosure, provided is a joined structure, including: a first member; and a second member that faces the first member and that is joined to the first member via a joining layer, wherein the joining layer includes a metal material and a solder material, a part of the metal material has at least one pore, and the solder material is located in a part of an internal area of the at least one pore.

Moreover, according to a second aspect of the disclosure, provided is a joining method, including: (i) supplying, onto a first surface of a first member, a nanometal paste at least including metal nanoparticles and a solvent, and a spacer; (ii) facing a second member to the first member, and pushing the second member onto the spacer, to mount the second member over the first member; (iii) heating a product obtained in Step (ii) at a temperature equal to or lower than a temperature where the solvent in the nanometal paste is evaporated, to cause the spacer to melt or decompose; (iv) heating the product resulting from Step (iii) at the temperature where the solvent in the nanometal paste is evaporated; and (v) heating the product resulting from Step (iv) at a temperature where the metal nanoparticles are sintered.

Furthermore, according to a third aspect of the disclosure, provided is a nanometal paste joining material, including metal nanoparticles, a solvent, and a spacer that is melted or decomposed at a temperature lower than a boiling point of the solvent.

As described above, according to the joining methods of the disclosure, in formation of joining layers in the sintering step using nanometal pastes, the spacers are melted or decomposed before the step of evaporation of solvents in the nanometal paste, and thus, subduction of the first member relative to the second member in association of the volumetric shrinkage caused during the evaporation of solvents or the progress of the sintering process is never impeded.

Accordingly, in the process from the temporal immobilization step to the sintering step, no spaces are caused between joining members and the nanometal paste even in a non-pressurized state, and thus, sufficient joint strength will be obtained.

Moreover, high-precision mounting of the second member using spacers becomes possible in the mounting step in which the temporal immobilization of the second member is carried out, and precision of thickness of the joining layer in the non-pressurization sintering process is determined. Therefore, high precision of the thickness of the joining layer can be maintained even after the sintering process.

Furthermore, because formation of the joining layer becomes possible in non-pressurization sintering processes according to the disclosure, any equipment involving control of high pressurization within a high-temperature atmosphere is not required, and also, it becomes possible to carryout a sintering treatment to multiple joined structures based on high-temperature furnace, at the same time.

Accordingly, the disclosure can provide cost-effective production processes.

Furthermore, some of pores produced in parts of the sintered metal in the joining layer formed by the above-described joining method are filled with spacer materials that have been melted and resolidified.

Accordingly, thermal conductivity can locally be increased around such pores, compared with hollow states.

Additionally, parts of the sintered metal, and the solder material, which serves as a material for the spacers, form an alloy, and thus, the formed alloy has a melting point higher than the solder material serving as the material for the spacers before the melting process. Therefore, remelting of the material can be prevented in the joined structure.

DESCRIPTION OF EMBODIMENTS

Hereinafter, embodiments of the disclosure will be described with reference to the drawings.

Embodiments

<Process>

Figure 1A:
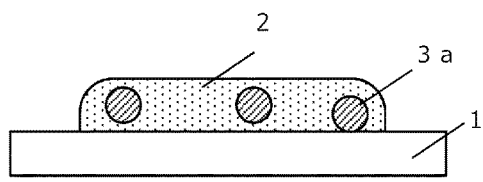
FIGS. 1A-1F are flowchart diagrams showing steps in a joining method according to a present embodiment.

FIGS. 1A-1F are flowchart diagrams showing steps in a joining method according to a present embodiment (i) Step of Supplying a Paste As shown in FIG. 1A, a nanometal paste 2, and spacers 3a are supplied onto a joining surface (top surface) of a first member 1.

The nanometal paste 2 has a composition including a solvent, and metal nanoparticles that are protected by a dispersing agent and that are dispersed in the solvent.

The first member 1 may be a printed wiring substrate, a ceramic wiring substrate, a heat releasing substrate having high thermal conductivity, or the like.

As an example of a method for supplying the paste onto the first member 1, a method in which the nanometal paste 2 including spacers 3a is supplied thereon based on screen printing or by using a dispenser can be mentioned.

When the spacers 3a are mixed into the nanometal paste 2 in advance, shapes of the spacers 3a may preferably be spherical. Otherwise, it would become very difficult to control orientations of the spacers 3a when the nanometal paste 2 is supplied onto the first member 1.

The joining surface of the first member 1 used in present embodiments may preferably be formed of a Cu solid material.

Alternatively, the joining surface may preferably be Ag- or Au-plated, because such a joining surface realizes excellent bondability with respect to metal nanoparticles.

Moreover, although the shapes of spacers 3a may preferably be spherical in present embodiments as mentioned above, the spacers 3a may be wire- or foil-shaped in cases in which a nanometal paste 2, and the spacers 3a are separately supplied onto the first member 1. In that case, the wire- or foil-shaped spacers 3a may be placed onto the first member 1, and then, the nanometal paste 2 may be coated thereon.

Furthermore, columnar solder-plated objects serving as spacers 3a are formed on the first member 1 in advance, and then, the nanometal paste 2 may be supplied thereto.

For the metal nanoparticles in the nanometal paste 2, metal particles (metal nanoparticles) with a mean particle diameter from about 0.5 nm to about 100 nm may be employed.

As an example of such metal nanoparticles, NPG-J manufactured by Harima Chemicals Group, Inc. (particle size: 3-7 nm) can be mentioned.

Furthermore, the metal nanoparticles may be made of a mono-element metal such as Ag, Au, Cu or Sn, or a multi-element metal such as SnAg, SnSb, or AuSn.

Additionally, metal particles with a particle size of 100 nm or more may be mixed into the nanometal paste 2, together with the metal nanoparticles.

For a solvent contained in the nanometal paste 2, terpineol, decanol, tetradecane, toluene, decalin, and the like can be employed.

For the spacers 3a, solder materials having a melting point equal to or lower than a boiling point of the solvent contained in the nanometal paste 2 may preferably be employed. For example, when terpineol or cecanol, which has a boiling point of above 200° C., is employed as a solvent for the nanometal paste 2, an SnZn-type solder having a melting point from about 190° C. to about 200° C. may be employed.

When decalin, which has a boiling point of about 186° C., is employed, for example, an SnBi-type solder having a melting point of about 140° C., an SnIn-type solder having a melting point of about 120° C. may be employed.

When toluene, which has a boiling point of about 110° C., a BiIn-type solder having a melting point of about 70° C. may preferably be employed.

Needless to say, other types of binary solders, and ternary or even higher multi-element solders can also be employed.

Additionally, thermoplastic resin materials, or rubbers that are decomposed at a temperature equal to or lower than a boiling point of the solvent contained in the nanometal paste 2 may be employed instead of solders.

(ii) Step Mounting a Second Member

Figure 1B:
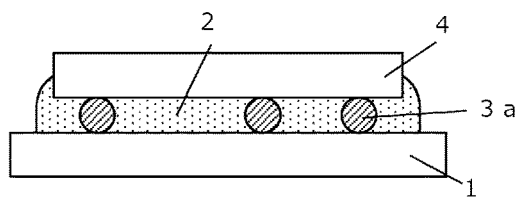

As shown in FIG. 1B, a second member 4 is mounted onto the first member 1 via the nanometal paste 2.

For example, the second member 4 may be a semiconductor element.

When the second member 4 is mounted thereon, the second member 4 is pushed onto the first member 1 such that the second member 4 is brought into contact with the spacers 3a.

In that case, by controlling the pressure such that a shrinkage of spacers becomes equal to or smaller than a certain value, a gap between the first member 1 and the second member 4 can highly precisely be maintained.

According to the present joining method, a device used for mounting the second member 4 onto the first member, a high degree of accuracy of the positional control in the mounting height direction is not required since the level can be adjusted only based on pressure control.

That is, even an inexpensive mounter or the like that not requires any expensive positional control functions be employed.

In heating steps described below, an area between the second member 4 and the first member 1 is not pressurized.

(iii) First Heating Step

Figure 1C:
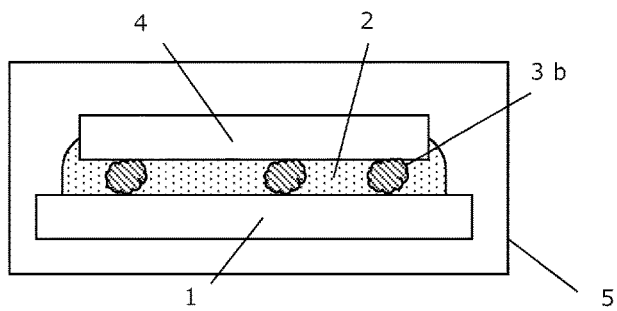

As shown in FIG. 1C, the product is heated in a high-temperature furnace 5 or the like, and thus, the spacers 3a are melted at a temperature where the solvent in the nanometal paste 2 is not evaporated, thereby forming spacers 3b in a molten state.

When the solvent contained in the nanometal paste 2 has a boiling point of 150° C. or higher, for example, an Sn58Bi solder having a melting point of around 140° C., and an Sn49In solder having a melting point of around 120° C. may preferably be employed for materials for the spacers.

Furthermore, when the solvent contained in the nanometal paste 2 has a boiling point of about 100° C., for example, an In33Bi solder having a melting point of around 80° C. may be employed for materials for the spacers.

As other types of solder materials, ternary solder materials such as SnBiIn and the like can be employed.

Additionally, although the spacers 3b are melted, the spacers 3b do not almost spread to the peripheries.

Wettability of the spacers 3b is different from wettability of surrounding materials, and therefore, the spacers 3b do not substantially spread thereto.

(iv) Second Heating Step

Figure 1D:
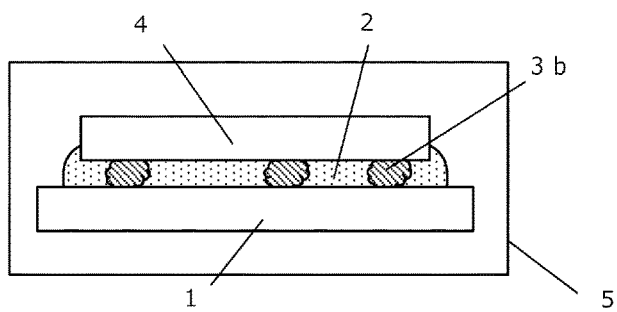

As shown in FIG. 1D, the product is heated to a temperature where the solvent contained in the nanometal paste 2 is evaporated, and thus, an amount of the solvent is reduced.

In that case, since a volume of the nanometal paste 2 is reduced depending on evaporation of the solvent, the second member 4 is caused to entirely subside, and thus, the joint level become smaller. However, components of the metal nanoparticles are uniformly remained over the entire joining surface of the second member 4, and therefore, precision of the joint level is maintained.

Furthermore, a molten state of the spacers 3b are maintained, and therefore, the subduction is not hindered.

Additionally, the reductions in the volume of the nanometal paste 2 in this step is determined almost depending on a blending ratio of the solvent in the nanometal paste 2, and the metal nanoparticles, and may typically be about 30% to about 50%.

Therefore, when spherical spacers 3a are employed, the size is preferably about 200% to about 285% of the volume of the joining layer 8 (FIG. 1F) in the produced joined structure, in consideration of shrinkages of the spacers 3a due to the pressure caused when the second member 4 is mounted onto the first member 1.

(v) Third Heating Step

Figure 1E:
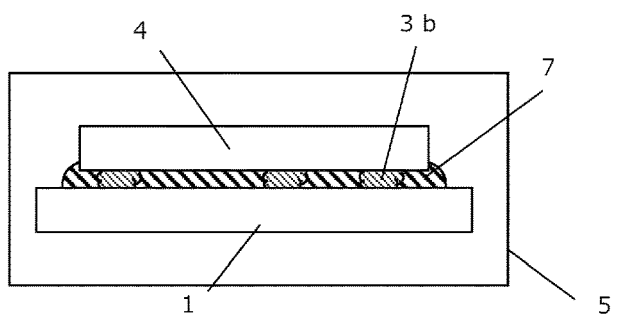

As shown in FIG. 1E, the product is heated to a temperature where the dispersing agent in the nanometal paste 2 is removed and where the metal nanoparticles are sintered, and is further allowed to stand at such a temperature until the sintering process is sufficiently progressed, thereby forming a sintered metal 7 mainly containing a rigid bulk metal.

(VI) Cooling Step

Figure 1F:
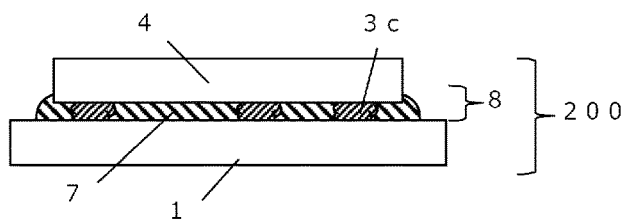

At last, as shown in FIG. 1F, by cooling the resulting material to an ordinary temperature, the molten spacers 3b are cooled, and thus, resolidified spacers 3c are formed, thereby forming a joining layer 8.

<Advantages>

In the steps of FIGS. 1C-1E in which heating treatments are involved, any pressurization is not required, and therefore, any steps requiring advanced control of pressurization in a high-temperature state becomes unnecessary.

Furthermore, in the step involving heating treatments, it becomes possible to employ general-purpose large high-temperature furnace or the like, and thus, treatments of multiple products becomes possible at the same time.

Accordingly, it becomes possible to reduce production costs.

Additionally, although a high-temperature furnace is employed for the heating steps in this embodiment, for example, a hot plate may be employed instead of it. Heating device used in the disclosure is not particularly limited to a high-temperature furnace.

<Prepared Semiconductor Devices>

Figure 2:
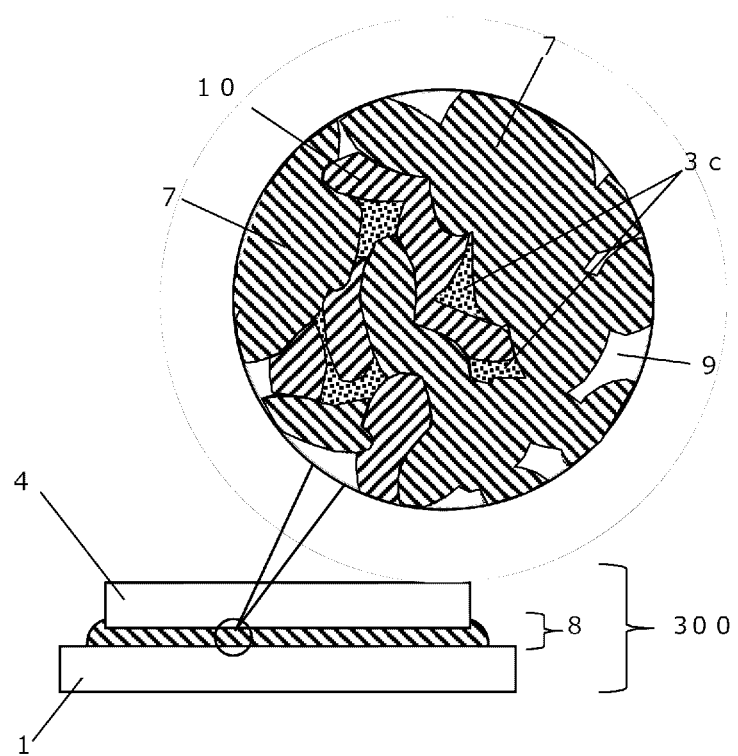
FIG. 2 is a cross-section view showing a state of a joining layer in a present embodiment.
Figure 3A:
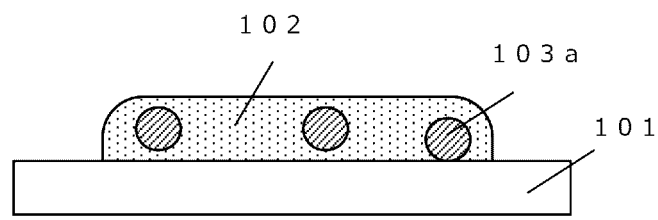
FIG. 3A-3D flowchart diagrams showing steps in the conventional joining method disclosed in JP-A-2011-71301.
Figure 3B:
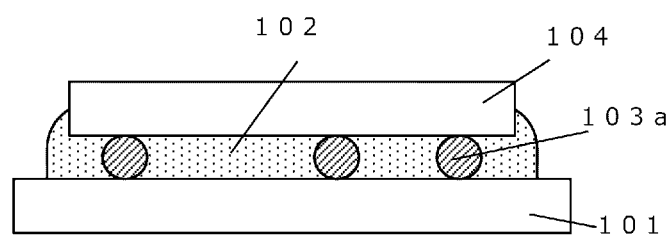
Figure 3C:
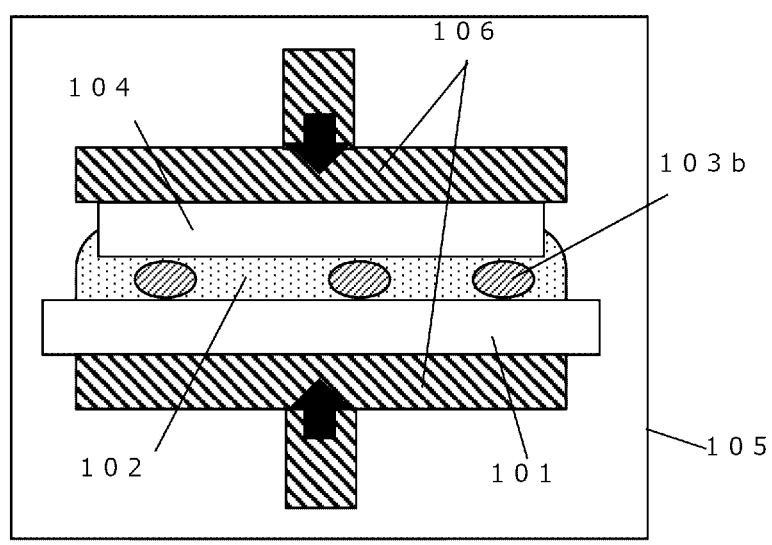
Figure 3D:
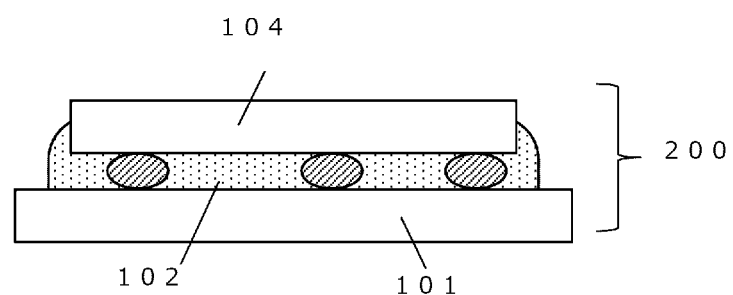

With reference to FIG. 2, a configuration of the joined structure 300 prepared based on the above-described joining method will be described.

FIG. 2 is a cross-section of the prepared joined structure 300. The joining layer 8 is formed by a sintered metal 7 that is formed through sintering of metal nanoparticles, a porous state 9 that is caused as a space that is caused because insufficient linkage of parts of metal nanoparticles during the sintering process, or a pore that is formed as a remining route, through which gases of the remained solvent or dispersing agent had passed, spacers 3c, that had been melted and then resolidified, and an alloy 10 including a sintered metal 7 and spacers 3c.

In this case, the resolidified spacers 3c are filled within some of pores.

Moreover, the above-mentioned paces and pores are small, and therefore, do not cause any adverse effects on bondability between the first member 1 and the second member 4.

However, the alloy 10 may not be formed depending on types of elements in the sintered metal and spacers.

Furthermore, any spacers 3c may not be present in some of the pores.

For example, although a bulk Ag material has a thermal conductivity of 418 W/m·K, the actual thermal resistance would go down as low as about 80-330 W/m·K since pores will be present in the sintered joining layer 8 when an Ag-based nanometal paste is sintered. However, according to the disclosure, it becomes possible to improve the thermal conductivity because some of the pores are filled with resolidified spacers 3c.

Additionally, for example, when the sintered metal 7 is Ag, and the material for the spacers 3c is a 67In-33Bi solder having a melting point of about 73° C., an AgBi alloy or the like having a melting point of about 262° C. is formed as the alloy 10.

When the alloying process of the spacers 3c is progressed, the melting point of the spacer 3c, which originally had a lower melting point, is shifted toward a higher temperature region, and thus, it becomes possible to prevent the jointed structure from remelting even when the resulting joined structure is subjected to a heat treatment or the like.

Furthermore, when a 42Sn-58Bi solder having a melting point of about 139° C. is employed as another type of material for the spacers 3c, an AgBi alloy having a melting point of about 262° C. or higher, an AgSn alloy having a melting point of about 221° C. or higher, or the like may be formed as an alloy 10.

For other materials for the spacers 3c, a binary solder material such as SnIn, and multielement solder materials such as SnBiIn may also be employed.

According to the disclosure, it becomes possible to secure excellent heat-releasing properties through the joining layer, and high joining reliability, while securing high precision of thickness of joining layer in the non-pressurization sintering joining process based on the metal nanoparticles.

Furthermore, since the disclosure does not require any expensive pressurization-control equipment under high-temperature environment, it becomes possible to reduce production costs.

Even if the area between first member 1 and the second member 4 is not pressurized in the heating steps, the first member 1 and the second member 4 can be joined without causing any large spaces.

In addition, the solder material (spacers 3c) and/or an alloy 10 are locally and continuously located throughout an area from the first member 1 to the second member 4 in the joined structure 300, as a result of the above process.

The disclosure is suitable for joining processes for production of high-heat-generating semiconductor devices requiring high heat resistance and heat releasing properties (e.g. power semiconductor devices and super luminosity LEDs).

What is claimed is:

1. A joining method, comprising:
   (i) supplying, onto a first surface of a first member, a nanometal paste at least comprising metal nanoparticles and a solvent, and a spacer;
   (ii) arranging a second member to face the first member, and pushing the second member onto the spacer, to mount the second member over the first member so as to form a product;
   (iii) heating the product obtained in Step (ii) at a first temperature that is lower than a second temperature at which the solvent in the nanometal paste is evaporated, to cause the spacer to melt or decompose;
   (iv) after the heating of the product at the first temperature, evaporating the solvent in the nanometal paste by heating the product at the second temperature at which the solvent in the nanometal paste is evaporated; and
   v) after the evaporating of the solvent, sintering the metal nanoparticles by heating the product at a third temperature at which the metal nanoparticles are sintered, the third temperature being higher than the first and second temperatures,
   wherein the spacer has a wire shape or a foil shape.

2. The joining method according to claim 1, wherein an area between the first member and the second member is not pressurized in Steps (iii), (iv) and (v).

3. The joining method according to claim 1, wherein the spacer is a solder material.

4. The joining method according to claim 3, wherein the solder material comprises Bi or In.

5. The joining method according to claim 1, wherein, in Step (i), the nanometal paste comprising the spacer in advance is supplied onto the first surface of the first member.

* * * * *